US006583055B1

(12) United States Patent
Chu

(10) Patent No.: US 6,583,055 B1
(45) Date of Patent: Jun. 24, 2003

(54) METHOD OF FORMING STEPPED CONTACT TRENCH FOR SEMICONDUCTOR DEVICES

(75) Inventor: Chien-Lung Chu, Taipei (TW)

(73) Assignee: Powerchip Semiconductor Corp., Hsin-chu (TW)

(*) Notice: Subject to any disclaimer, the term of this patent is extended or adjusted under 35 U.S.C. 154(b) by 0 days.

(21) Appl. No.: 10/057,142

(22) Filed: Jan. 25, 2002

(51) Int. Cl.[7] ............................ H01L 21/4763
(52) U.S. Cl. .................. 438/638; 438/640; 438/701; 438/713
(58) Field of Search ................ 438/620, 621, 438/624, 627, 634, 637, 638, 639, 640, 666, 667, 701, 713

(56) References Cited

U.S. PATENT DOCUMENTS

| 5,180,689 A | * | 1/1993 | Liu et al. ............ 438/640 |
| 5,203,957 A | * | 4/1993 | Yoo et al. ........... 438/640 |
| 5,492,853 A | * | 2/1996 | Jeng et al. .......... 438/666 |
| 5,604,159 A | * | 2/1997 | Cooper et al. ....... 483/666 |
| 5,872,053 A | * | 2/1999 | Smith .................. 438/640 |
| 5,888,887 A | * | 3/1999 | Li et al. .............. 438/640 |
| 6,444,574 B1 | * | 9/2002 | Chu .................... 438/638 |

* cited by examiner

Primary Examiner—John F. Niebling
Assistant Examiner—Lynne A. Gurley
(74) Attorney, Agent, or Firm—Ladas & Parry

(57) ABSTRACT

A method of forming a stepped contact trench with doped trench sidewalls for shutting off parasitic edge transistors. The method includes the steps of forming a cap layer on a semiconductor substrate; sequentially forming a first dielectric layer and a second dielectric layer on the cap layer; etching a preliminary contact hole through the second dielectric layer and the first dielectric layer; implanting dopants in the substrate through the preliminary contact hole and then annealing to diffuse the dopants to form a first doped region; etching to remove the cap layer exposed by the preliminary contact hole; etching the substrate underneath the preliminary contact hole to form a trench with the doped region provided at the upper edges of the trench; isotropically etching the sidewalls of the preliminary contact hole with an etching agent having a higher etch rate for the second dielectric layer than for the first dielectric layer, thereby forming a contact hole having a stepped sidewall; and etching to remove the cap layer exposed by the stepped contact hole.

19 Claims, 9 Drawing Sheets

METHOD OF FORMING STEPPED CONTACT TRENCH FOR SEMICONDUCTOR DEVICES

BACKGROUND OF THE INVENTION

1. Field of the Invention

The present invention relates in general to a contact forming method for a semiconductor device. More particularly, it relates to a method of forming a stepped contact trench with doped trench sidewalls.

2. Description of the Related Arts

One important technique for fabricating a semiconductor device involves forming a connection between an upper level wiring layer and either a conductive region of an impurity-diffused layer in a semiconductor substrate or a lower level wiring layer. Such a connection is preferably formed through a contact hole formed in interlayer insulating film.

As the density of integrated circuits has increased, the design rule, i.e., the minimum feature size, has decreased. With this increasing scale of integration of semiconductor devices, the diameters of contact holes are accordingly being made even smaller; however, it is difficult to reduce the depths of contact holes because of the need for wiring resistance or capacity. For this reason, the aspect ratios of contact holes have rapidly increased in recent years, and there has been a high demand for forming metal electrodes featuring good coverage.

FIGS. 1A to 1C are cross-sections at selected stages of a conventional fabrication process for forming a contact trench and a barrier metal film. Referring to FIG. 1A, on a semiconductor substrate 10, an interlayer dielectric (ILD) layer 14 is provided with a cap layer 12 interposed. The ILD layer 14 generally consists of one or more dielectric depositions of spin on glass (SOG), silicon oxide; borophosphosilicate (BPSG), and so on. The cap layer 12, serving as a diffusion barrier to prevent diffusion of impurities in the ILD layer 14 into the substrate 10, is typically silicon nitride (SiN), though other materials may be used.

Next, as illustrated in FIG. 1B, a contact opening 16 is etched through the ILD layer 14 and the cap layer 12 using a photoresist pattern as a mask. The etching is further carried into the substrate 10 to a predetermined depth to form a trench portion 16a below the substrate surface. Here, because the silicon nitride cap layer 12 is less liable to be etched as compared with the substrate 10 and the ILD layer 14, an overhang configuration H is created within the contact hole 16.

Thereafter, a conventional method of forming a contact is by sputtering a Ti/TiN barrier layer 18 over the ILD layer 14 and over bottom and sidewalls of the contact hole 16. However, as illustrated in FIG. 1C, the overhang H makes sputtering of the barrier layer very difficult. The step coverage of the Ti/TiN layer 18 is especially poor on sidewalls of the trench 16a. The insufficient coverage of Ti/TiN barrier 18 leads to high contact resistance and yield problems, and stable electrical characteristics of a contact electrode cannot be obtained. In addition, as the trench widths have gotten progressively smaller recently, the devices have become subject to additional leakage paths caused by formation of parasitic edge transistors at upper edges of the trench sidewalls. Parasitic edge transistors are not desired because they increase the OFF current of the devices and increase the susceptibility to latchup.

SUMMARY OF THE INVENTION

An object of the present invention is to provide a method of forming a contact trench which provides better step coverage.

Another object of the invention is to provide a method of forming a contact trench which overcomes the parasitic transistor problem.

The above and other objects of the invention are accomplished by forming a contact trench with stepped sidewalls and by implanting dopants into trench regions before the trenches are etched.

In one preferred embodiment of the invention, the stepped contact trench is formed by: forming a cap layer on a semiconductor substrate; sequentially forming a first dielectric layer and a second dielectric layer on the cap layer; etching a preliminary contact hole through the second dielectric layer and the first dielectric layer; implanting dopants in the substrate through the preliminary contact hole and then annealing to diffuse the dopants to form a doped region; etching to remove the cap layer exposed by the preliminary contact hole; etching the substrate underneath the preliminary contact hole to form a trench with the doped region provided at the upper edges of the trench; isotropically etching the sidewalls of the preliminary contact hole with an etching agent having a higher etch rate for the second dielectric layer than for the first dielectric layer, thereby forming a contact hole with a stepped sidewall; and etching to remove the cap layer exposed by the stepped contact hole.

In another preferred embodiment of the invention, the stepped contact trench is formed by: forming a cap layer on a semiconductor substrate; sequentially forming a first dielectric layer and a second dielectric layer on the cap layer; etching a preliminary contact hole through the second dielectric layer and the first dielectric layer; etching to remove the cap layer exposed by the preliminary contact hole; implanting first dopants in the substrate through the preliminary contact hole and annealing to diffuse the dopants to form a first doped region; isotropically etching the sidewalls of the preliminary contact hole with an etching agent having a higher etch rate for the second dielectric layer than for the first dielectric layer, thereby forming a contact hole with a stepped sidewall; optionally implanting second dopants in the substrate through the stepped contact hole and then annealing to diffuse the dopants to form a second doped region; etching the substrate underneath the stepped contact hole to form a trench with the first doped region provided at the upper edges of the trench; and etching to remove the cap layer exposed by the stepped contact hole.

BRIEF DESCRIPTION OF THE DRAWINGS

The above and other objects, features, and advantages of the present invention will become apparent from the following detailed description of preferred embodiments of the invention explained with reference to the accompanying drawings, in which.

Figure 1A:
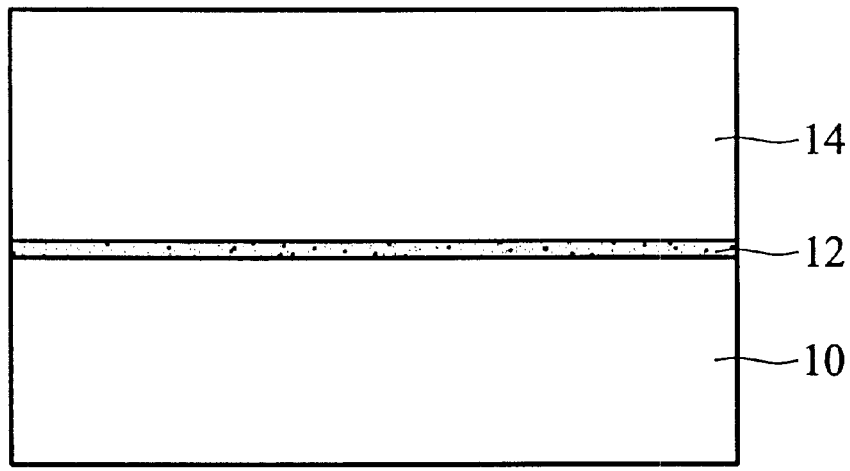
FIGS. 1A to 1C are cross-sections illustrating the steps of a conventional method for forming a contact trench and a barrier metal layer.
Figure 1B:
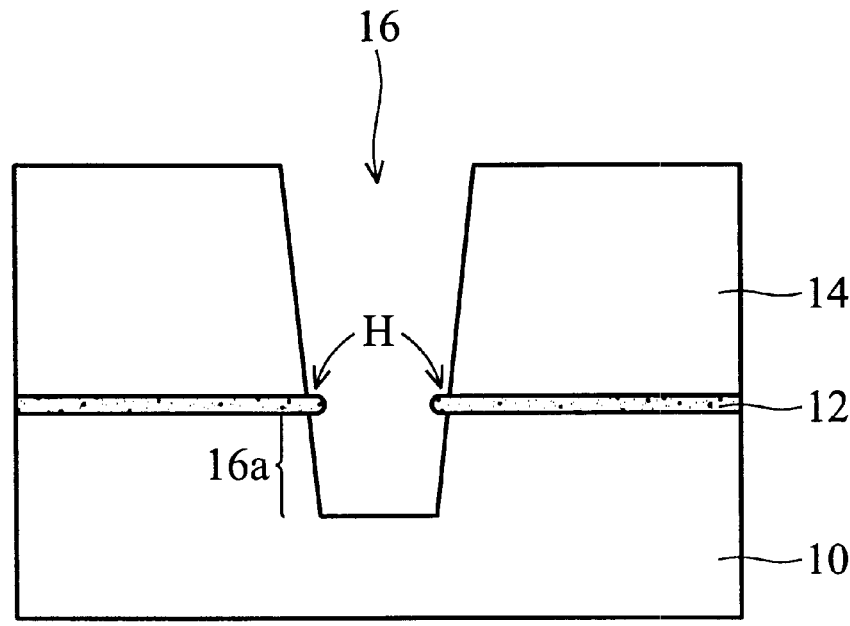
Figure 1C:
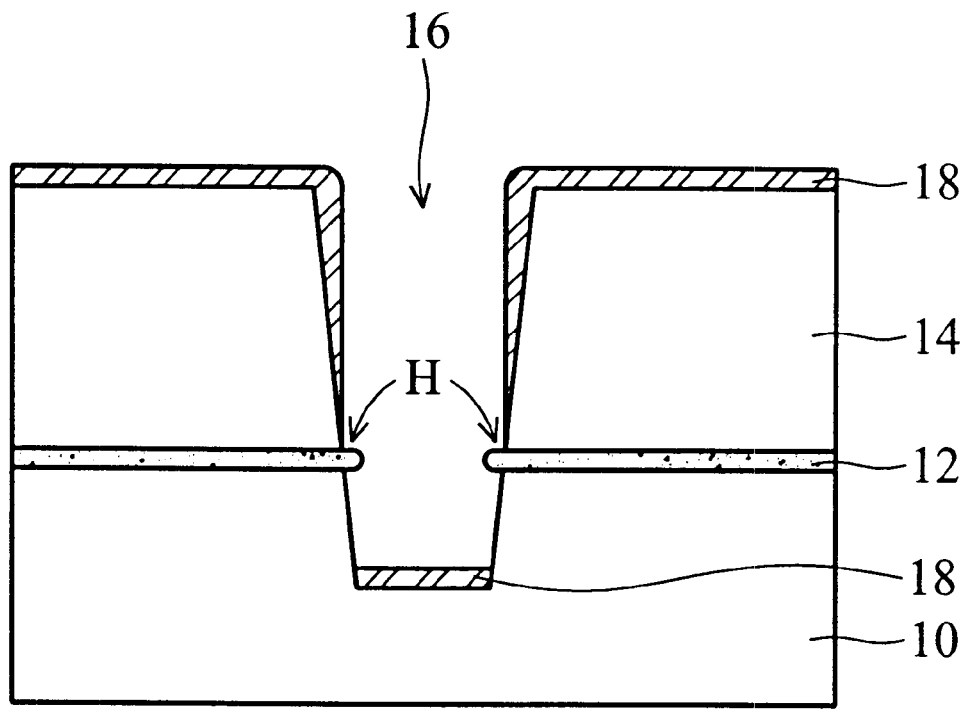

REFERENCE NUMERALS IN THE DRAWINGS 10 semiconductor substrate
12 cap layer
14 ILD layer
16 contact hole
16a trench
H overhang
18 barrier layer
100 semiconductor substrate
102 cap layer
104 ILD layer
106 preliminary contact hole
108 first doped region
110 trench
112 stepped contact hole
114 barrier layer
116 contact plug
118 second doped region

DETAILED DESCRIPTION OF THE INVENTION

First Embodiment

Figure 2A:
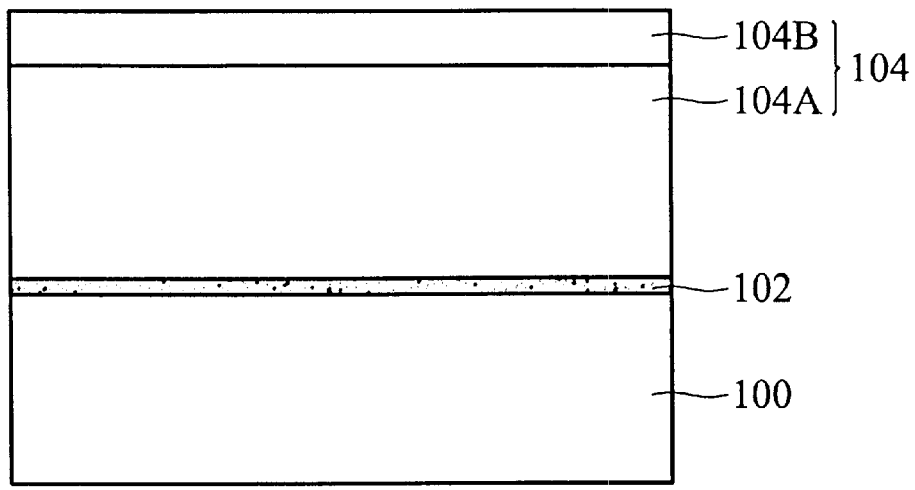
FIGS. 2A to 2H are cross-sections illustrating the steps for forming a stepped contact trench according to a first embodiment of the invention.

There will now be described a first embodiment of this invention with reference to FIGS. 2A–2H. As shown in FIG. 2A, the method begins by providing a semiconductor substrate 100 such as a silicon substrate. The substrate 100 is understood to possibly include a semiconductor wafer, active and passive semiconductor devices/elements formed within the wafer and layers formed on the wafer surface. In the context of this document, the term "substrate" is mean to include devices formed within a semiconductor wafer and the layers overlying the wafer.

First, the substrate surface is capped with a cap layer 102 of silicon nitride with a thickness between about 150 and 200 Å. The cap layer 102 serves as a diffusion barrier to prevent diffusion of impurities into the substrate 100. The silicon nitride layer 102 can be formed by reacting dichlorosilane ($SiCl_2H_2$) with ammonia ($NH_3$) through a low pressure chemical vapor deposition (LPCVD) process. The silicon nitride cap layer 102 can be replaced by other materials suitable for serving as a diffusion barrier, such as silicon oxynitride (SiON).

Next, a ILD layer 104 consisting of a first dielectric layer 104A and a second dielectric layer 104B having different etch rates is formed over the cap layer 102. As will become apparent, this invention requires that the second (upper) dielectric layer 104B has a faster etch rate with respect to the first (lower) dielectric layer 104A to create a desirable stepped profile. Preferably, the second dielectric layer 104B is composed of undoped oxide and the first dielectric layer 104A is composed of doped oxide. More preferably, the second dielectric layer 104B is composed of TEOS oxide (oxide deposited from a gas flow containing tetraethylorthosilane (TEOS)) and the first dielectric layer 104A is composed of BP-TEOS (borophospho-TEOS) oxide. The ILD layer 104 preferably has a planarized surface as shown.

Figure 2B:
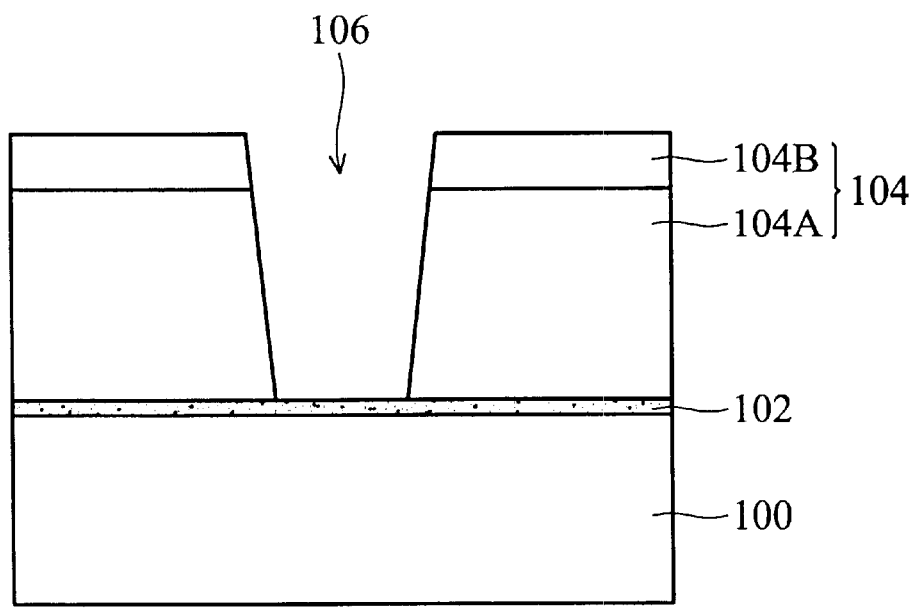

Then, as illustrated in FIG. 2B, a preliminary contact hole 106 is anisotropically etched through the ILD layer 104 using a photoresist pattern as a mask. The etch process may be by reactive ion etching or other like anisotropic etching techniques. The preliminary contact hole 106 can be etched using an etch recipe comprising $CF_4$ until the cap layer 102 is exposed. In an alternative embodiment, the preliminary contact hole 106 is etched through the ILD layer 104 and the cap layer 102 to expose the substrate 100.

Figure 2C:
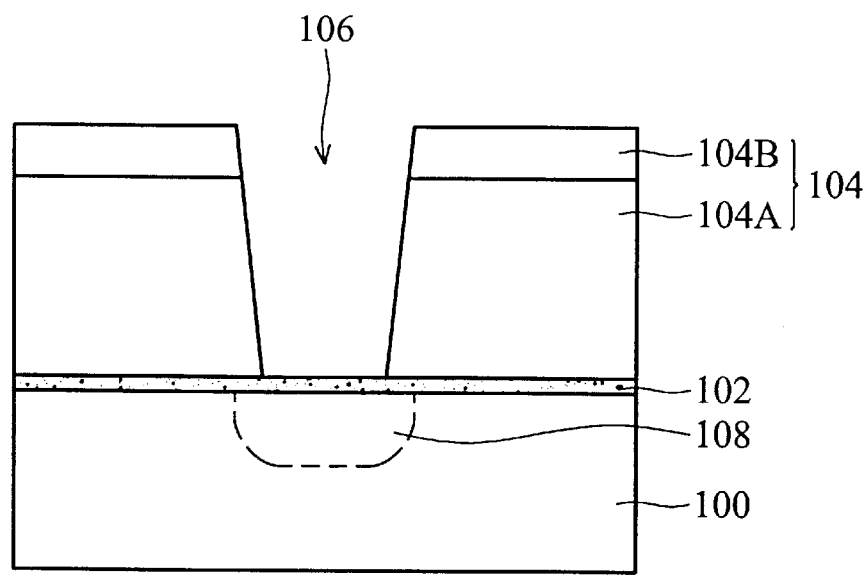

Referring to FIG. 2C, an important feature of the present invention is illustrated. Ions are implanted into the substrate 100 through the preliminary contact hole 106 to form an implanted region in the substrate 100. The implanted region is subsequently annealed to drive the dopants laterally into a doped region 108, which is larger in width than the implanted region. The doped region 108 is formed for the purpose of shutting off parasitic transistors, which will become apparent later. The doped region 108 can be either a P-doped region formed by implanting B, $BF_2$ or $BCl_2$ ions, or a N-doped region formed by implanting P, Sb or As ions, depending upon the intended application. The annealing is preferably performed at a temperature between about 850 and 975° C.

Figure 2D:
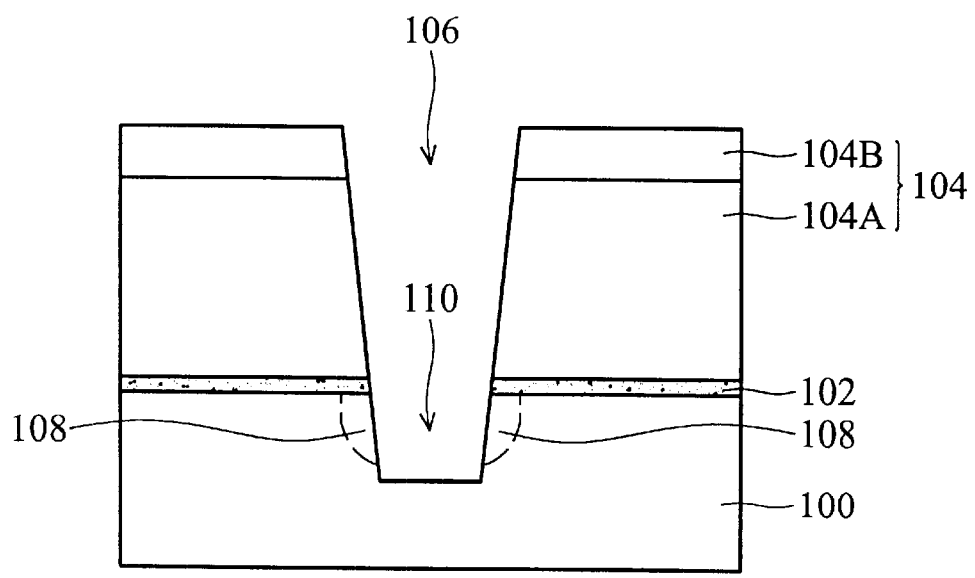

Next, referring to FIG. 2D, the cap layer 102 exposed under the preliminary contact hole 106 is removed by anisotropic etching. The etching is further carried into the substrate 100 to a predetermined depth, and accordingly a trench 110 is formed with the doped region 108 provided at the upper edges of the trench 110. By introducing dopants into the trench sidewalls, the parasitic edge transistors are shut off and the phenomena known as a "subthreshold kink" in the Id versus Vg characteristic curve is suppressed. The nitride cap layer 102 can be etched using gases such as $CCl_2F_2$ or $CHF_3$ and the substrate 100 can be etched using gases such as $Cl_2$, $BCl_3/CCl_4$, or $SiCl_4/Cl_2$. The trench 110 is preferably less than 1,500 Å below the substrate surface.

Figure 2E:
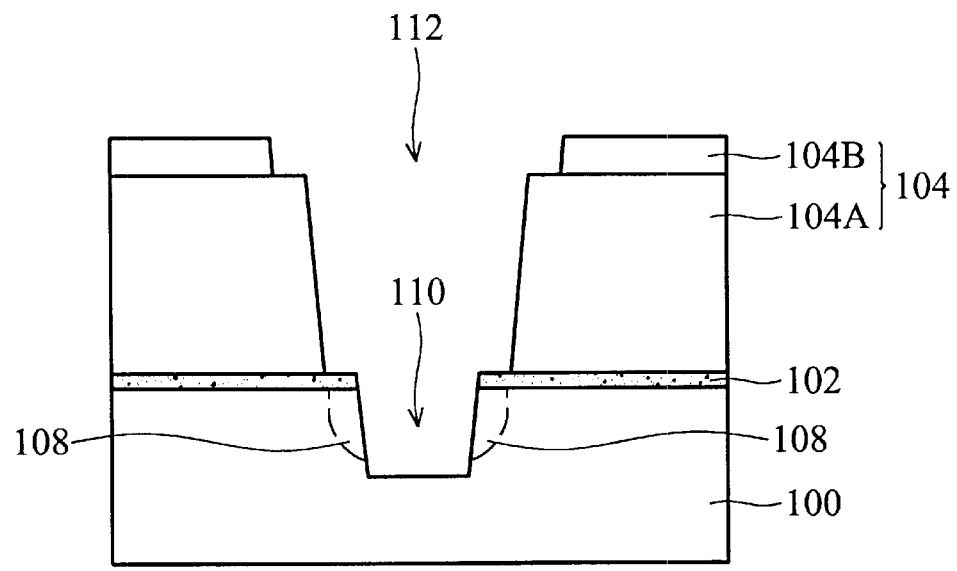

Next, the sidewalls of the preliminary contact hole 106 are isotropically etched in a wet etching process. A suitable etching agent is so chosen that the second dielectric layer 104B is etched more quickly than the first dielectric layer 104A. Thus, the sidewall in the second dielectric layer 104B is encroached to a larger extent than in the first dielectric layer 104A, and a desirable stepped profile is created. FIG. 2E illustrates a contact hole 112 having stepped sidewalls thus created. It is found that undoped oxide can be etched more quickly than doped oxide by a buffered HF solution (a mixed solution of $NH_4F$ and HF). Therefore, when the second dielectric layer 104B is undoped oxide and the first dielectric layer 104A is doped oxide, a buffered HF solution can be used for this etching, though it is commonly used for cleaning purposes. An additional advantage of this step is that the upper surface of the second dielectric layer 104B can be planarized by the wet etching agent.

It should be noted that the order, in which the above-described process steps of: etching the substrate to form a trench 110; and isotropically etching the sidewalls of the preliminary contact hole to form a stepped contact hole 112, is interchangeable.

Figure 2F:
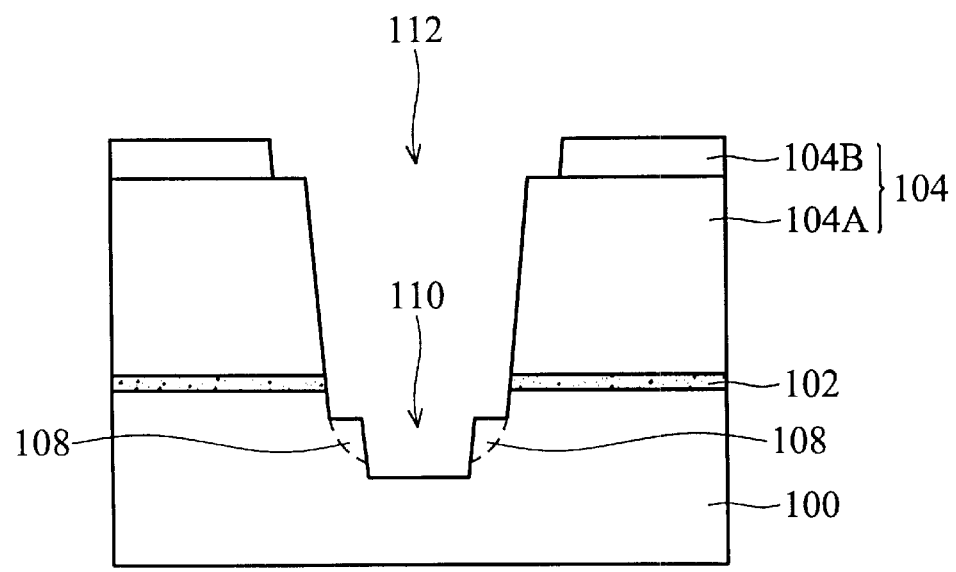

The above isotropic etching also exposes additional surface of the cap layer 102. Therefore, an anisotropic etching process is performed to remove the exposed portions of the capping layer 102 to complete the stepped contact trench fabrication. As illustrated in FIG. 2F, this etching is preferably carried into the underlying substrate 100 so that stepped sidewalls can be created in the trench portion 110 to provide even better step coverage.

Figure 2G:
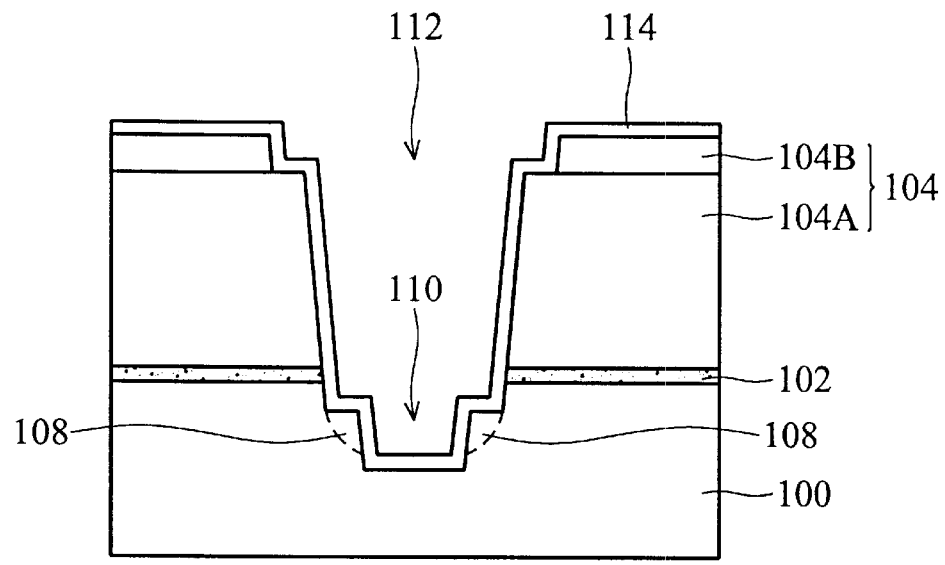
Figure 2H:
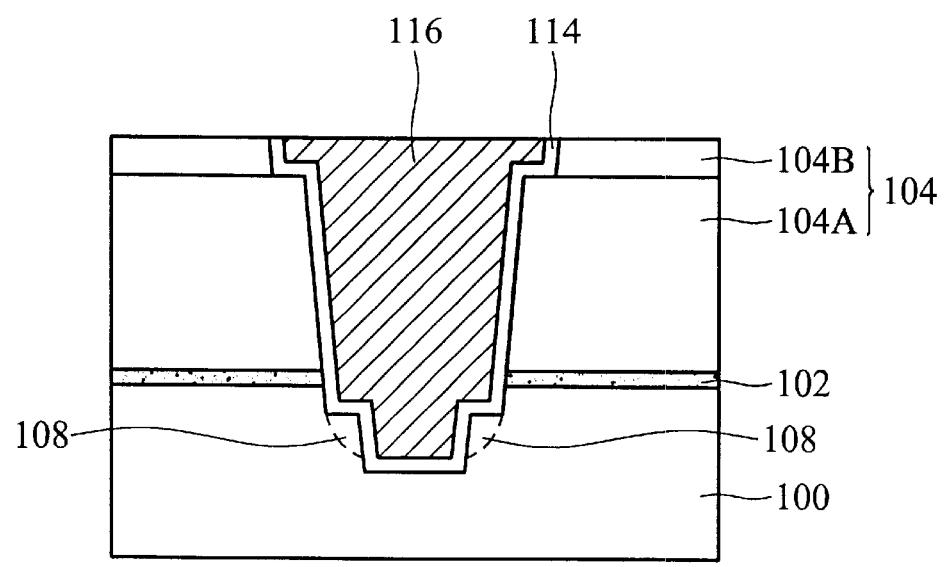

Following this, referring to FIG. 2G, a conformal barrier metal layer 114 such as a Ti/TiN layer or the like, can be deposited by sputtering with a good step coverage over the sidewalls and bottom of the contact hole 112. Thereafter, a conductive material is deposited to overfill the contact hole 112 by use of the CVD (Chemical Vapor Deposition) or PVD (Physical Vapor Deposition) method. Suitable conductive materials include W, Al, Cu, Al—Si—Cu alloy, and Al—Cu alloy. After this, the barrier metal layer 114 and conductive material outside of the contact hole 112 are removed by etch back or chemical mechanical polishing to form a contact plug 116 as shown in FIG. 2H.

Second Embodiment

Hereinafter, a second embodiment of the method for fabricating a stepped contact trench according to the present invention will be described with reference to FIGS. 3A to 3E.

Figure 3A:
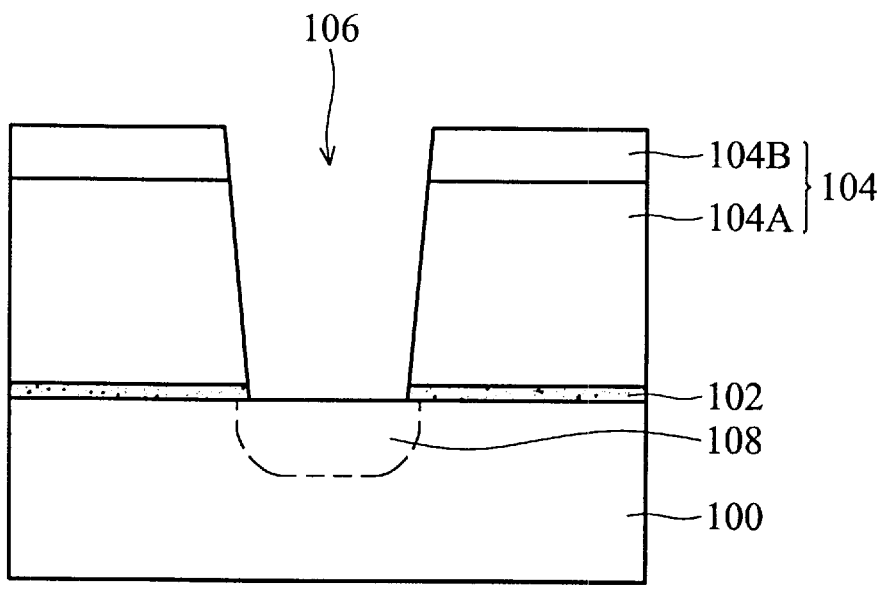
FIGS. 3A to 3E cross-sections illustrating the steps for forming a stepped contact trench according to a second embodiment of the invention.

Referring to FIG. 3A, in this embodiment, the anisotropic etching of a preliminary contact hole 106 is further carried into the cap layer 102 to expose the substrate 100. Then a first doped region 108 is formed by ion implantation and heat treatment as in the first embodiment.

Figure 3B:
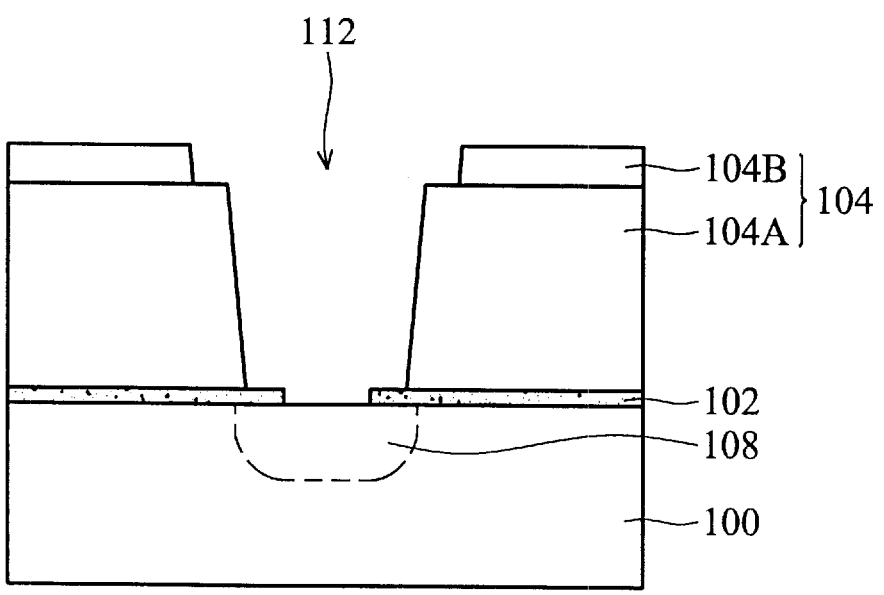

Thereafter, referring to FIG. 3B, a stepped contact hole 112 is formed by a wet etching procedure using, for example, a buffered HF solution, before etching a trench in the substrate 100 as in the first embodiment.

Figure 3C:
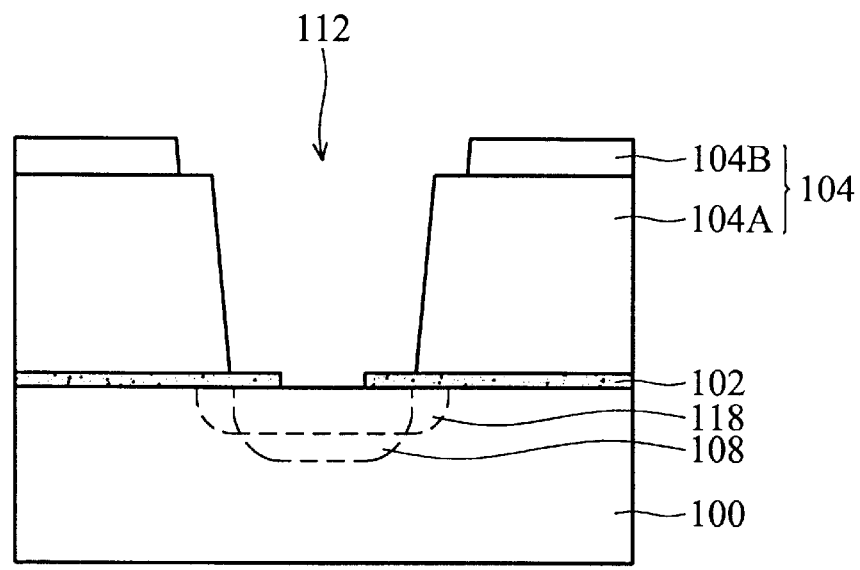

Next, referring to FIG. 3C, as a key aspect of this embodiment, an optional second doped region 118 can be formed by implanting ions through the stepped contact hole followed by heat treatment. The second doped region 118 can function as a lightly-doped drain (LDD) region as is well known in the art. Forming a LDD region at this stage is advantageous in impoving device reliability, because it avoids some heat cycles that increase the depletion region of devices, for example, the reflow of ILD layer.

Figure 3D:
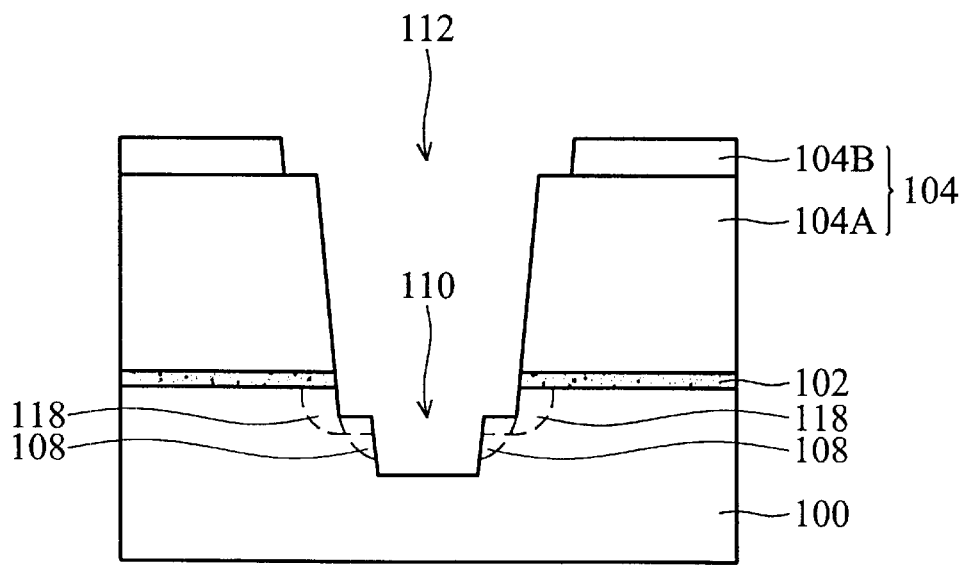
Figure 3E:
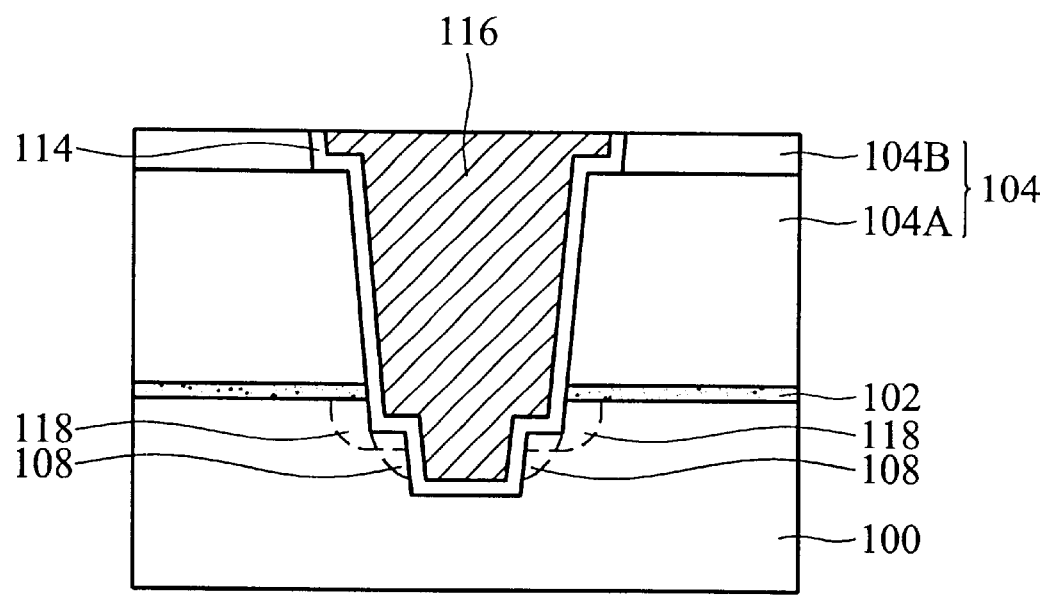

Following this, a trench 110 is etched in the substrate 100 and the portions of the cap layer 102 exposed by the stepped contact hole 112 is also removed by etch. As shown in FIG. 3D, the doped sidewalls of the trench 110 reduces the possibility of parasitic edge transistors. Finally, referring to FIG. 3E, a barrier metal layer 114 with good step coverage and a contact plug 116 are formed in the stepped contact hole as in the first embodiment.

While the invention has been particularly shown and described with reference to the preferred embodiment thereof, it will be understood by those skilled in the art that various changes in form and details may be made without departing from the spirit and scope of the invention.

What is claimed is:

1. A method of forming a stepped contact trench for a semiconductor device, comprising the steps of:

forming a cap layer on a semiconductor substrate;

sequentially forming a first dielectric layer and a second dielectric layer on the cap layer;

etching a preliminary contact hole through the second dielectric layer and the first dielectric layer;

implanting dopants in the substrate through the preliminary contact hole and then annealing to diffuse the dopants to form a doped region;

etching to remove the cap layer exposed by the preliminary contact hole;

etching the substrate underneath the preliminary contact hole to form a trench with the doped region provided at the upper edges of the trench;

isotropically etching the sidewalls of the preliminary contact hole with an etching agent having a higher etch rate for the second dielectric layer than for the first dielectric layer, thereby forming a contact hole with a stepped sidewall; and etching to remove the cap layer exposed by the stepped contact hole.

2. The method as claimed in claim 1, wherein the cap layer comprises silicon nitride.

3. The method as claimed in claim 1, wherein the cap layer comprises silicon oxynitride.

4. The method as claimed in claim 1, wherein the first dielectric layer is doped oxide, and the second dielectric layer is undoped oxide.

5. The method as claimed in claim 1, wherein the first dielectric layer is BP-TEOS oxide (borophospho-tetraethylorthosilicate) and the second dielectric layer is TEOS oxide (tetraethylorthosilicate).

6. The method as claimed in claim 1, wherein the annealing is performed at a temperature between about 850 and 975° C.

7. The method as claimed in claim 1, wherein the etching agent is a buffered HF solution.

8. The method as claimed in claim 1, wherein the upper surface of the second dielectric layer is planarized by the etching agent during the step of isotropically etching to form the stepped contact hole.

9. The method as claimed in claim 1, wherein the trench has a depth less than 1500 Å below the substrate surface.

10. A method for forming a stepped contact trench for a semiconductor device, comprising the steps of:

forming a cap layer on a semiconductor substrate;

sequentially forming a first dielectric layer and a second dielectric layer on the cap layer;

etching a preliminary contact hole through the second dielectric layer and the first dielectric layer;

etching to remove the cap layer exposed by the preliminary contact hole;

implanting first dopants in the substrate through the preliminary contact hole and then annealing to diffuse the dopants to form a first doped region;

isotropically etching the sidewalls of the preliminary contact hole with an etching agent having a higher etch rate for the second dielectric layer than for the first dielectric layer, thereby forming a contact hole with a stepped sidewall;

optionally implanting second dopants in the substrate through the stepped contact hole and then annealing to diffuse the dopants to form a second doped region;

etching the substrate underneath the stepped contact hole to form a trench with the first doped region provided at the upper edges of the trench; and etching to remove the cap layer exposed by the stepped contact hole.

11. The method as claimed in claim 10, wherein the cap layer comprises silicon nitride.

12. The method as claimed in claim 10, wherein the cap layer comprises silicon oxynitride.

13. The method as claimed in claim 10, wherein the first dielectric layer is doped oxide, and the second dielectric layer is undoped oxide.

14. The method as claimed in claim 10, wherein the first dielectric layer is BP-TEOS oxide (borophospho-tetraethylorthosilicate) and the second dielectric layer is TEOS oxide (tetraethylorthosilicate).

15. The method as claimed in claim 10, wherein the annealing is performed at a temperature between about 850 and 975° C.

16. The method as claimed in claim 10, wherein the etching agent is a buffered HF solution.

17. The method as claimed in claim 10, wherein the upper surface of the second dielectric layer is planarized by the etching agent during the step of isotropically etching to form the stepped contact hole.

18. The method as claimed in claim 10, wherein the trench has a depth less than 1500 Å below the substrate surface.

19. The method as claimed in claim 10, wherein the second doped region is a lightly-doped drain region.

* * * * *